(12) United States Patent
Ivanov

(10) Patent No.: US 9,442,175 B2
(45) Date of Patent: Sep. 13, 2016

(54) CAPACITIVE SENSOR DEVICE AND METHOD FOR CALIBRATING A CAPACITIVE SENSOR DEVICE

(75) Inventor: Artem Ivanov, Lundshut (DE)

(73) Assignee: MICROCHIP TECHNOLOGY GERMANY GMBH, Gilching (DE)

(*) Notice: Subject to any disclaimer, the term of this patent is extended or adjusted under 35 U.S.C. 154(b) by 266 days.

(21) Appl. No.: 14/129,351

(22) PCT Filed: Jun. 28, 2012

(86) PCT No.: PCT/EP2012/062650
§ 371 (c)(1),
(2), (4) Date: May 30, 2014

(87) PCT Pub. No.: WO2013/001047
PCT Pub. Date: Jan. 3, 2013

(65) Prior Publication Data
US 2014/0292351 A1 Oct. 2, 2014

(30) Foreign Application Priority Data

Jun. 29, 2011 (DE) .......................... 10 2011 078 369

(51) Int. Cl.
*G01R 35/00* (2006.01)
*H03K 17/955* (2006.01)
*G01D 5/24* (2006.01)

(52) U.S. Cl.
CPC .............. *G01R 35/005* (2013.01); *G01D 5/24* (2013.01); *H03K 17/955* (2013.01); *H03K 2217/94026* (2013.01); *H03K 2217/960775* (2013.01)

(58) Field of Classification Search
CPC ..... G01R 35/005; G01D 5/24; H03K 17/955
See application file for complete search history.

(56) References Cited

U.S. PATENT DOCUMENTS

| 5,394,097 A | * | 2/1995 | Bechtel | ................. | G01N 27/02 324/631 |
| 5,430,381 A | * | 7/1995 | Dower | ..................... | G01B 7/34 324/452 |

(Continued)

FOREIGN PATENT DOCUMENTS

| CN | 1499720 A | 5/2004 | ............... H01H 1/06 |
| DE | 10323030 A1 | 12/2004 | ............. B25J 19/02 |

(Continued)

OTHER PUBLICATIONS

International Search Report and Written Opinion, Application No. PCT/EP2012/062650, 13 pages, Oct. 26, 2012.

(Continued)

*Primary Examiner* — Jeff Natalini
(74) *Attorney, Agent, or Firm* — Slayden Grubert Beard PLLC

(57) ABSTRACT

A capacitive sensor device for approach and/or contact detection has at least one generator electrode, at least one measurement electrode and at least one calibration electrode, wherein the at least one calibration electrode is arranged in a predefined distance adjacent to the at least one measurement electrode, wherein the at least one measurement electrode and the at least one calibration electrode are assigned to the generator electrode, wherein the at least one generator electrode may be loaded with a generator voltage and the at least one calibration electrode may be loaded with a calibrating voltage, and wherein the at least one calibration electrode at least may be operated in a first operating mode and a second operating mode, wherein in each of the operating modes the calibrating voltage lies between a ground voltage and the generator voltage, and the calibrating voltage is different in each operating mode.

20 Claims, 3 Drawing Sheets

(56) References Cited

U.S. PATENT DOCUMENTS

| | | | |
|---|---|---|---|
| 6,452,514 B1 | 9/2002 | Philipp | 341/33 |
| 7,114,402 B2 | 10/2006 | Winkler et al. | 73/862.626 |
| 7,839,282 B1* | 11/2010 | Mathur | G01D 5/2405 |
| | | | 324/519 |
| 2003/0009273 A1 | 1/2003 | Stanley et al. | 701/45 |
| 2009/0256578 A1* | 10/2009 | Wuerstlein | G01D 5/2405 |
| | | | 324/601 |
| 2009/0319134 A1* | 12/2009 | Haemmerl | B66F 9/0755 |
| | | | 701/50 |
| 2010/0231231 A1* | 9/2010 | Boschetti | G01N 33/46 |
| | | | 324/601 |
| 2011/0025345 A1* | 2/2011 | Unterreitmayer | G06F 1/3203 |
| | | | 324/600 |
| 2011/0192227 A1* | 8/2011 | Post | G01C 19/56 |
| | | | 73/514.01 |
| 2011/0199105 A1* | 8/2011 | Otagaki | G06F 3/044 |
| | | | 324/679 |
| 2013/0057299 A1 | 3/2013 | Unterreitmayer | 324/629 |

FOREIGN PATENT DOCUMENTS

| | | | | |
|---|---|---|---|---|
| DE | 102009057933 B3 | 2/2011 | | G01D 5/24 |
| DE | 102009032357 B3 | 6/2011 | | H03K 17/955 |
| DE | 102009057931 A1 | 6/2011 | | G01D 5/24 |
| EP | 1583236 A1 | 10/2005 | | B60R 25/00 |
| WO | 2009/130165 A2 | 10/2009 | | G06F 3/033 |
| WO | 2013/001047 A1 | 1/2013 | | H03K 17/955 |

OTHER PUBLICATIONS

Chinese Office Action, Application No. 201280039515.1, 6 pages, Dec. 24, 2015.

* cited by examiner

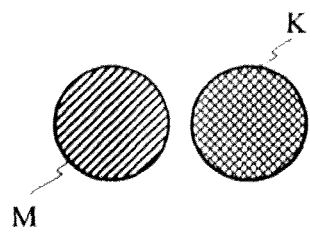
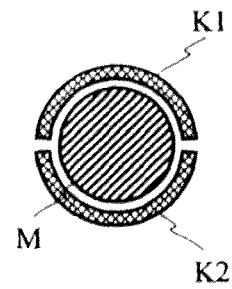
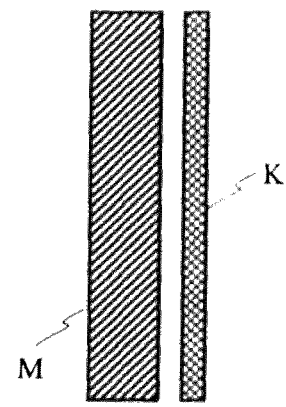
Fig. 1a Fig. 1b Fig. 1c
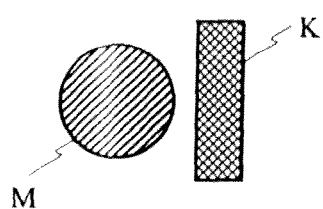
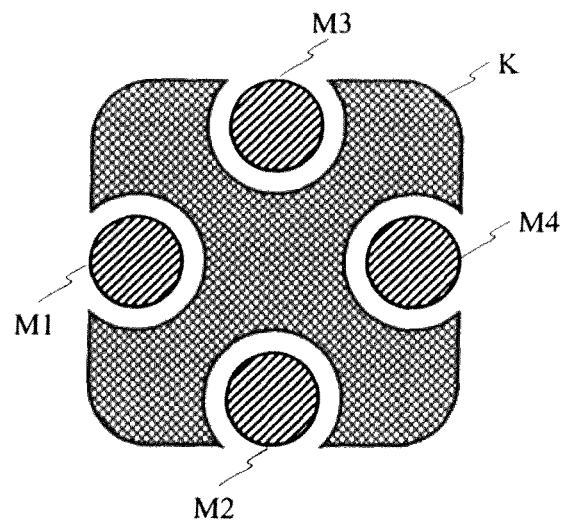
Fig. 1d Fig. 1e

CAPACITIVE SENSOR DEVICE AND METHOD FOR CALIBRATING A CAPACITIVE SENSOR DEVICE

CROSS-REFERENCE TO RELATED APPLICATIONS

This application is a U.S. National Stage Application of International Application No. PCT/EP2012/062650 filed Jun. 28, 2012, which designates the United States of America, and claims priority to DE Patent Application No. 10 2011 078 369.5 filed Jun. 29, 2011. The contents of which are hereby incorporated by reference in their entirety.

TECHNICAL FIELD

The invention relates to a capacitive sensor device for approach and/or contact detection and to a method for calibrating a capacitive sensor device according to the invention. In addition, the invention relates to a handheld device, in particular an electric handheld device, comprising a capacitive sensor device according to the invention, which may be calibrated using the method according to the invention.

BACKGROUND

In capacitive sensor devices, by means of which an approach and/or a contact shall be detected, it may be required that the capacitive sensor device has to be calibrated once or in predefined temporal intervals. For example, a calibration of the capacitive sensor device may be required to ensure a high accuracy of detection also in changing ambient conditions.

A problem in the calibration of capacitive sensor devices exists in that the sensor device may not be calibrated at each arbitrary point in time, for example when objects are in the proximity of the capacitive sensor device, i.e. in the proximity of the measurement electrodes of the capacitive sensor device. The objects arranged in the proximity of the sensor device may negatively affect the calibration of the sensor system so that the sensor device in the end is calibrated erroneous. Therefore it is desirable to calibrate the sensor device at a point in time at which no objects affecting the calibration procedure are arranged in the proximity of the capacitive sensor device.

In addition it is desirable to calibrate a capacitive sensor device directly after the activation and after the power-on, respectively, of the capacitive sensor device so that, for example, a capacitive sensor device provided in an electric handheld device may be used directly after power-on of the handheld device. According to prior art the capacitive sensor device is calibrated directly after power-on of the electric handheld device or after the activation of the capacitive sensor device within a predefined period of time, approximately one second. In order to be able to carry out an orderly calibration the user is not allowed to handle the handheld device during this period of time since this in turn would negatively affect the calibration. The user of the handheld device may be informed, for example via a display device that the capacitive sensor device is in a calibrating phase. In doing so, however, it is not ensured that the user does not still manipulate the handheld device during the calibrating phase. In addition, such a calibration method is unacceptable, if only for ergonomic reasons.

A further possibility known in prior art for calibrating a capacitive sensor device is to carry out the calibration when the raw data of the capacitive sensor device have not changed or only have changed very little during a predefined period of time, for example because the user has deposited the electric handheld device. However, it is a disadvantage with this method that it cannot be ensured that a calibration of the sensor system is carried out at all, because it is not ensured that the raw data of the sensor device do not change or only change very little during a predefined period of time. In addition it is disadvantageous that the raw data of the capacitive sensor device are processed in an uncalibrated manner by all means until the point in time, in which a calibration is carried out, which may result in erroneous detections of approaches and/or contacts.

In a further solution known from prior art the user of an electric handheld device activates the calibrating action. For example, this may be carried out by means of actuating a button specifically provided to do so. Alternatively, the calibrating action also may be activated by carrying out predefined gestures, wherein such gestures should be provided, which also may be recognized from the initially uncalibrated raw data of the sensor device. Such gestures, for example, may be swiping gestures or a quick removal of a finger put down on the electric handheld device prior to that. This method has the disadvantage that, because the calibration is initiated by the user, the sensor device is not calibrated during a longer period of time, because the user may have forgotten to initiate the calibration or does not know that he/she has to carry out a calibration. A further disadvantage is that a carrying out of the gestures provided for the activation of the sensor system may result in an unintended calibration and that it is not ensured, that for example fingers or the hands do not negatively affect the calibration.

SUMMARY

According to various embodiments, solutions can be provided, which allow for calibrating a capacitive sensor device, in particular a capacitive sensor device provided in an electric handheld device, wherein the determination of an advantageous time of calibration does not comprise the disadvantages known from prior art and wherein the sensor device also then may be calibrated, when objects are in the proximity of the capacitive sensor device and in the proximity of the measurement electrode, respectively.

According to various embodiments, provided is a capacitive sensor device for approach and/or contact detection comprising at least one generator electrode, at least one measurement electrode and at least one calibration electrode, wherein the at least one calibration electrode is arranged in a predefined distance adjacent to the at least one measurement electrode, wherein the at least one measurement electrode and the at least one calibration electrode are assigned to the generator electrode, wherein the at least one generator electrode may be loaded with a generator voltage and the at least one calibration electrode may be loaded with a calibrating voltage, and wherein the at least one calibration electrode may be operated at least in a first operating mode and a second operating mode, wherein in each of the operating modes the calibrating voltage lies between a ground voltage and the generator voltage, and the calibrating voltage is different in each operating mode.

The capacitive sensor device may further comprise an evaluation device, which at least may be coupled with the measurement electrode and the calibration electrode and which is designed to load the calibration electrode with a first calibrating voltage in the first operating mode and to detect a first capacitance between the measurement electrode and the ground of the sensor device, and to load the calibration electrode with a second calibrating voltage in the second operating mode and to detect a second capacitance between the measurement electrode and the ground of the sensor device.

Preferably, the shape of the calibration electrode substantially is adapted to the shape of the measurement electrode.

The measurement electrode and the calibration electrode may be arranged on a printed circuit board. The printed circuit board preferably comprises a cut-out in the region between the measurement electrode and the calibration electrode.

One calibration electrode may be assigned to a number of measurement electrodes.

The generator electrode may be arranged at the underside of the printed circuit board and the at least one measurement electrode and the at least one calibration electrode may be arranged at the upper side of the printed circuit board.

According to further embodiments, in a method for calibrating a capacitive sensor device, wherein the sensor device comprises at least one generator electrode, at least one measurement electrode and at least one calibration electrode, wherein the at least one measurement electrode and the at least one calibration electrode are arranged in a predefined distance adjacent to each other and are assigned to the at least one generator electrode, the at least one generator electrode is loaded with a generator voltage, the calibration electrode is loaded with a first calibrating voltage in a first operating mode and a first sensor signal is tapped at the measurement electrode, the calibration electrode is loaded with a second calibrating voltage in a second operating mode and a second sensor signal is tapped at the measurement electrode, a difference between the first sensor signal and the second sensor signal is determined, and the calibration of the capacitive sensor device is carried out, when the difference in its absolute value is greater than a predefined threshold value.

Preferably, the first calibrating voltage is chosen to be different to the second calibrating voltage. In addition, both calibrating voltages preferably are chosen such that they each lie between a measurement voltage and the generator voltage.

It has proven to be advantageous, when the shape of the calibration electrode substantially is adapted to the shape of the measurement electrode.

The measurement electrode and the calibration electrode may be arranged on a printed circuit board, wherein the printed circuit board comprises a cut-out in the region between the measurement electrode and the calibration electrode.

A preliminary calibration of the capacitive sensor device may be carried out, when the difference in its absolute value is smaller than the predefined threshold value, wherein from the first and the second sensor signal a distance of an object from the measurement electrode is derived and estimated, respectively, and the sensor data of the capacitive sensor device are calibrated with the estimated distance.

The first sensor signal and the second sensor signal each may comprise sensor raw data.

In addition, provided is a handheld device, in particular an electronic handheld device, which comprises a capacitive sensor device as described above, wherein the capacitive sensor device may be calibrated, in particular according to the method described above.

A capacitive sensor device comprising a number of measurement electrodes may be provided at the handheld device, wherein at least to some of the measurement electrodes each a dedicated calibration electrode is assigned or wherein to all measurement electrodes each a single calibration electrode is assigned. All of the measurement electrodes may be calibrated in a single calibration step. Alternatively, for each of the measurement electrodes a dedicated calibration step or calibration phase may be carried out so that all measurement electrodes may be calibrated independent of each other.

The electric handheld device, for example, may be a smart phone, a mobile radio unit, a computer mouse, a remote control, a keyboard, a digital camera, a mobile mini computer, a tablet-PC or another electric handheld device.

BRIEF DESCRIPTION OF THE DRAWINGS

Further details and characteristics of the invention as well as specific exemplary embodiments of the invention result from the following description together with the drawings.

FIGS. 1a-1e show different embodiments of an electrode configuration of a capacitive sensor device, wherein the electrode configurations each comprise at least one measurement electrode and at least one calibration electrode;

DETAILED DESCRIPTION

Figure 2:
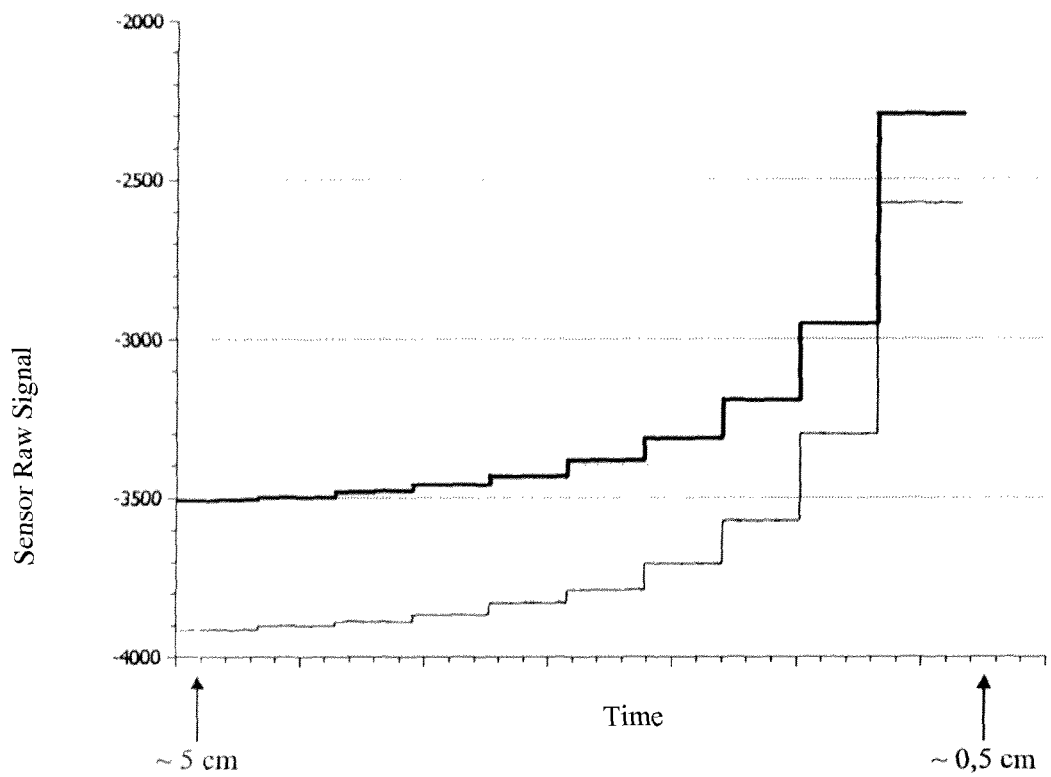
FIG. 2 shows raw signals of a capacitive sensor device over time during a first operating mode as well as during a second operating mode of the capacitive sensor device and of the calibration electrode, respectively.

FIG. 1a to FIG. 1e each show an electrode configuration of a sensor device according to various embodiments.

FIG. 1a shows an electrode configuration of a sensor device according to various embodiments comprising a measurement electrode M and a calibration electrode K. The calibration electrode K is arranged in a predefined distance from and adjacent to the measurement electrode M. It is advantageous, when the calibration electrode K is placed as close as possible to the measurement electrode M. The distance between the calibration electrode K and the measurement electrode M, however, at least should be large enough so that the calibration electrode K does not affect the measurement electrode M too strong.

The calibration electrode K and the measurement electrode M may be coupled with an evaluation device not shown here. The evaluation device is designed such that the calibration electrode K may be operated in at least two operating modes. The following descriptions are limited to the case that the calibration electrode K is operated in a first operating mode B1 and in a second operating mode B2. However, the calibration electrode K also may be operated in further operating modes. The following descriptions in an accordant manner also apply to the further operating modes.

The evaluation device is designed to load a generator electrode not shown here with a generator voltage $U_{GEN}$ and to load the calibration electrode K with a calibrating voltage $U_{KAL}$.

In an embodiment, at the underside of a printed circuit board one or more generator electrodes G may be arranged (see FIGS. 4A and 4b) and at the upper side of the printed circuit board the measurement electrodes and the calibration electrodes may be arranged. The generator electrode G is loaded with a generator signal. For example, the generator signal may be a low-pass filtered square wave signal of approximately 100 kHz. Also feasible are generator signals designed differently, in particular comprising a different frequency. In an advantageous embodiment a generator electrode G is provided, which is designed having a large surface area. It is the purpose of the generator electrode G loaded with the generator signal to establish an electric alternating field around the generator electrode G.

The measurement electrode and the measurement electrodes, respectively, are connected high resistive to the evaluation device. In doing so, the measurement electrodes virtually are invisible for the electric alternating field, however, are still able to measure the amplitude of the electric alternating field. The amplitude measured at a measurement electrode substantially depends on the distance of a conductive object from the measurement electrode so that the distance from the object may be derived from the amplitudes measured at the measurement electrodes.

According to various embodiments the calibration electrode K is loaded with a first calibrating voltage $U_{KAL1}$ in the first operating mode B1and is loaded with a second calibrating voltage $U_{KAL2}$ in the second operating mode B2.

The calibrating voltages $U_{KAL1}$, $U_{KAL2}$ on the one hand are chosen such that they lie between a ground voltage $U_{GND}$ of the capacitive sensor device and the generator voltage $U_{GEN}$ of the capacitive sensor device in each of the two operating modes. On the other hand, the calibrating voltage $U_{KAL1}$ in the first operating mode B1 is different to the calibrating voltage $U_{KAL2}$ in the second operating mode B2. For example, in the first operating mode the first calibrating voltage $U_{KAL1}$ may be 0 V ($U_{GND}$) and in the second operating mode the second calibrating voltage $U_{KAL2}$ may be the generator voltage $U_{GEN}$. According to various embodiments the first calibrating voltage $U_{KAL1}$ also may be different to and greater, respectively, than the ground voltage $U_{GND}$ of the capacitive sensor device.

The second calibrating voltage $U_{KAL2}$ also may be different to and smaller than, respectively, the generator voltage $U_{GEN}$. According to various embodiments the first calibrating voltage $U_{KAL1}$ and the second calibrating voltage $U_{KAL2}$ are to be chosen such that the following condition is met:

$U_{KAL1}=A*U_{GEN}$; $U_{KAL2}=B*U_{GEN}$, with $0 \le A$, $B \le 1$ and $A \ne B$ With more than two operating modes the respective calibrating voltages are to be chosen such that the following condition is met:

$U_{KAL1} \ne U_{KAL2} \ne \ldots \ne U_{KALn}$, for all $n\in\{$operating modes$\}$.

Instead of the generator voltage $U_{GEN}$ according to various embodiments also another voltage comprising a similar form may be used.

In addition, it is also feasible that for example in the first operating mode the calibration electrode K is not connected to an electric potential (floating conductor).

When the capacitive sensor device comprises more than one measurement electrode M then to all measurement electrodes or to only several measurement electrodes each a calibration electrode K may be assigned and be placed adjacent in a predefined distance from the measurement electrodes, respectively. In doing so, the calibration electrodes each may be loaded with the same signal, i.e. the calibration electrodes may be coupled with a shared signal generator, which provides the calibrating voltage $U_{KAL}$, $U_{KAL1}$, $U_{KAL2}$, ... $U_{KALn}$. In addition, it is feasible to provide on a number of measurement electrodes a single calibration electrode K, which consists of several electrode segments connected to each other, as for example shown with reference to FIG. 1e.

As already described, an electric alternating field is emitted each at the generator electrode and at the calibration electrode K. By means of the evaluation device, which is coupled with the measurement electrode M and the calibration electrode K, the capacitance of the measurement electrode M to ground of the capacitive sensor device is detected and measured, respectively. The electric alternating field emitted at the calibration electrode K modifies the field distribution of the electric alternating field emitted at the generator electrode, wherein the influence on the field distribution of the electric alternating field emitted at the calibration electrode K onto the electric alternating field emitted at the generator electrode depends on the operating mode in which the calibration electrode K is operated.

The modification of the field distribution of the electric alternating field emitted at the generator electrode effectively causes a variation of the capacitance of the measurement electrode M to be measured to the ground of the sensor. When no object is positioned in the proximity of the capacitive sensor device and in the proximity of the measurement electrode and the calibration electrode, respectively, of the capacitive sensor device, the capacitive sensor device may be calibrated by means of the capacitance variation to be expected during a transition from the first operating mode into the second operating mode, or by means of the capacitances to be expected in the first operating mode and in the second operating mode.

When the difference of the capacitances between the first operating mode and the second operating mode in its absolute value exceeds a predefined threshold value, it may be acted on the assumption that no object is in the proximity of the electrodes of the capacitive sensor device. In this case, a calibration of the sensor device according to various embodiments may be carried out.

Also, in the case that an object is in the proximity of the electrodes of the capacitive sensor device a calibration, for example a preliminary or provisional calibration of the capacitive sensor device may be carried out, as is described in more detail below.

Therewith it may now be determined, if a point in time is available that is advantageous for the calibration of the sensor device, wherein in the case that the point in time is disadvantageous for a calibration either a preliminary calibration or no calibration of the sensor device at all is carried out. However, it is advantageous during power-on of a handheld device, which comprises a capacitive sensor device according to various embodiments, to calibrate the sensor device in each case, either by means of a preliminary or provisional calibration or by means of a calibration, which is carried out when there is no object in the proximity of the sensor electrodes.

It is advantageous for an optimum operation of the capacitive sensor device, i.e. in order to determine the point in time for calibration reliably, to arrange the calibration electrode K close to the measurement electrode M on the one hand and to adapt the shape of the calibration electrode substantially to the shape of the measurement electrode M on the other hand. The distance between the calibration electrode K and the measurement electrode M, however, should at least be large enough so that the calibration electrode K does not affect the measurement electrode M too strong. For example, for a small compact measurement electrode a small compact calibration electrode may be provided, which is arranged close to the measurement electrode. In addition, for example for an elongated measurement electrode an elongated calibration electrode may be provided.

An adaptation of the shape of the calibration electrode K to the shape of the measurement electrode M has the advantage that the effect of the electric alternating field, emitted at the calibration electrode K, onto the field distribution of the electric alternating field emitted at the generator electrode by all means then is maximized, when it is determined with the help of the method according to various embodiments, whether a calibration of the capacitive sensor device may be carried out.

In the exemplary embodiment of the electrodes shown in FIG. 1a the measurement electrode M as well as the calibration electrode K are formed circular and substantially have an identical electrode surface.

FIG. 1b shows a circular measurement electrode M and two calibration electrodes K1 and K2 formed as ring segments. The electrodes are arranged relative to one another such that the measurement electrode M is arranged between the two calibration electrodes K1 and K2 formed as ring segments. The calibration electrodes K1, K2 each may be operated with the same signal, i.e. in the first operating mode both calibration electrodes are loaded with a first calibrating voltage $U_{KAL1}$, and in the second operating mode they are loaded with a second calibrating voltage $U_{KAL2}$.

Due to the identical embodiment of the calibration electrodes and the symmetrical arrangement of the calibration electrodes in the first operating mode, for example, only the calibration electrode K1 may be loaded with the first calibrating voltage $U_{KAL1}$ and in the second operating mode only the calibration electrode K2 may be loaded with the second calibrating voltage $U_{KAL2}$ In order to ensure a better function, it is advantageous however, to load in both operating modes in each case both calibration electrodes with the respective calibrating voltage.

FIG. 1c shows a further example of an electrode arrangement of a capacitive sensor device. The measurement electrode M and the calibration electrode K1 each are formed elongated here, wherein the calibration electrode is less wide than the measurement electrode M. However, the calibration electrode K also may be equal in width with the measurement electrode M or may be wider than the measurement electrode M.

FIG. 1d shows a further example of an electrode configuration of a capacitive sensor device. Here, the measurement electrode substantially is formed circular. The calibration electrode K substantially is formed rectangular, wherein the surface areas of the two electrodes preferably are identical.

FIG. 1e shows a further example of an electrode configuration of a capacitive sensor device. In this example the electrode configuration comprises four measurement electrodes M1 to M4 and one calibration electrode K. Here, the calibration electrode K is formed such that it at least partially surrounds each of the four measurement electrodes M1 to M4. Alternatively, the calibration electrode K also may be formed such that it completely surrounds the four measurement electrodes M1 to M4.

According to various embodiments it may be determined for each individual measurement electrode M1 to M4 independent from the respective other ones whether a suitable point in time for the calibration of the capacitive sensor device exists. In an embodiment the capacitive sensor device may be calibrated, when the prerequisites for a calibration are fulfilled for all four measurement electrodes M1 to M4. In another embodiment each individual measurement electrode may be calibrated individually and independent of the other measurement electrodes, i.e. the sensor raw signal associated with the respective measurement electrode is calibrated independent of the sensor raw signals of the remaining measurement electrodes. This is an advantage in particular then, when the measurement electrodes are widely spaced from each other and the ambient conditions of the widely spaced measurement electrodes differ from each other.

Calibration Method and Method for Determining a Calibration Instant:

In the following the method for calibrating a capacitive sensor device and for determining a favorable point in time for calibrating the capacitive sensor device is described in more detail.

The method according to various embodiments is described on the basis of a capacitive sensor device comprising a measurement electrode M and a calibration electrode K, wherein the method also may be carried out for a capacitive sensor device comprising a number of measurement electrodes and a number of calibration electrodes, which are assigned to the measurement electrodes. In addition, the following description of the method according to various embodiments is given on the basis of the assumption that two operating modes are provided for the operation of the calibration electrode.

Of course the method according to various embodiments in a respective manner also then may be applied, when more than two operating modes are provided for the operation of the calibration electrode, as already described with reference to FIG. 1a.

For example, the measurement electrode and the calibration electrode are formed and arranged relative to one another, as described with reference to FIG. 1a to FIG. 1e. The generator electrode is loaded with a generator voltage $U_{GEN}$, wherein the generator voltage $U_{GEN}$ stays the same in each operating mode of the calibration electrode K.

In a first step the calibration electrode K is operated in a first operating mode B1. In the first operating mode B1 the calibration electrode K1 is loaded with a first calibrating voltage $U_{KAL1}$ and a first capacitance between the measurement electrode M and the ground of the sensor device is detected, wherein sensor raw data of the measurement electrode M are detected.

Subsequently, in a second step it is switched from the first operating mode B1 into a second operating mode B2 for operating the calibration electrode K. In the second operating mode B2 the calibration electrode K is loaded with a second calibrating voltage $U_{KAL2}$, which is different from the first calibrating voltage $U_{KAL1}$ of the first operating mode B1. The first calibrating voltage $U_{KAL1}$ and the second calibrating voltage $U_{KAL2}$ here are chosen such as described with reference to FIG. 1a. In the second step, i.e. during the operation of the calibration electrode in the second operating mode B2, a second capacitance is detected between the measurement electrode M and the ground of the sensor device, wherein again sensor raw data of the measurement electrode M are detected.

FIG. 2 shows the temporal course of the sensor raw data detected in the first operating mode and in the second operating mode of the measurement electrode M. The upper curve shows the detected sensor raw data, which have been detected in the first operating mode. The lower curve shows the sensor raw data, which have been detected in the second operating mode. In the example shown here, the distance of an object from the measurement electrode M has been reduced in steps from about 5 cm to about 0.5 cm during the measurement, wherein the size of the steps is about 0.5 cm. As can be seen from FIG. 2 the effect of the calibration electrode on the sensor raw signals reduces during switching from the first operating mode into the second operating mode with decreasing distance of the object from the measurement electrode, i.e. the difference of the sensor raw signals in the first operating mode to the sensor raw signals in the second operating mode progressively decreases with decreasing distance of the object from the measurement electrode.

In a further step of the method according to various embodiments the difference of the sensor raw data measured in the previous steps is determined.

Figure 3:
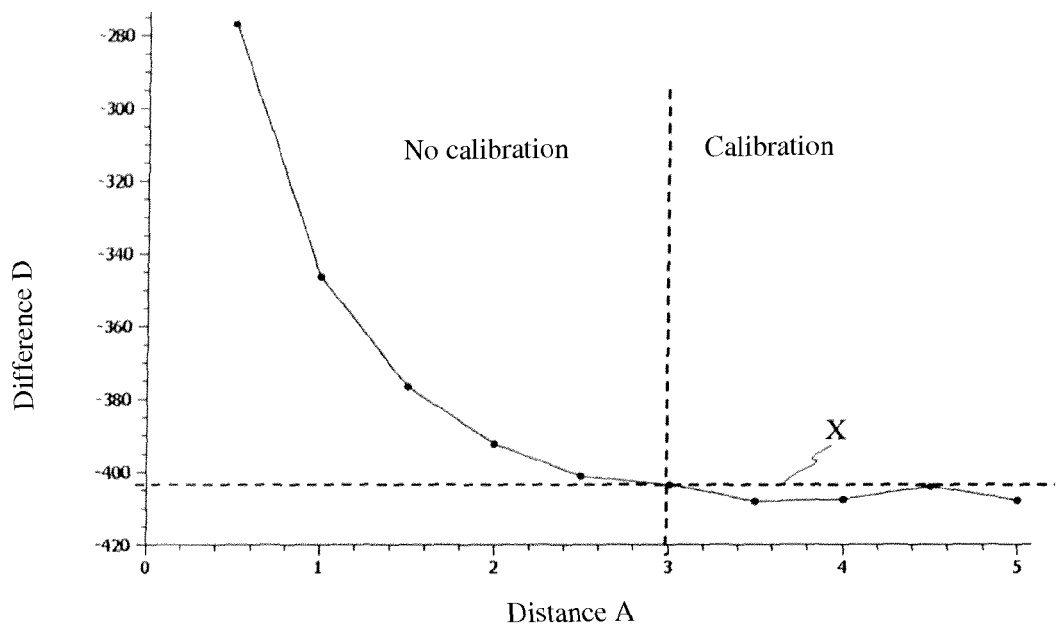
FIG. 3 shows the difference of the raw signals shown in FIG. 2 in dependency of the distance of an object from the measurement electrode.

The difference between the sensor raw data in the first operating mode and the second operating mode is shown in FIG. 3, wherein the curve shows the difference in dependency of the distance of the object from the measurement electrode M. It is evident, that the absolute value of the difference between the sensor raw data of the first operating mode and the sensor raw data of the second operating mode increases and becomes greater, respectively, with increasing distance of the object from the measurement electrode M. It also is evident from FIG. 3 that a conclusion about the distance of the object from the measurement electrode may be made for distances of the object from the measurement electrode of 0 cm to about 3 cm, while with distances of the object from the measurement electrode greater than 3 cm the difference virtually stays the same.

When the difference D in its absolute value is greater than a predefined threshold value X it is acted on the assumption that an advantageous point in time for the calibration of the capacitive sensor device exists, because there is no object in the proximity of the measurement electrode and no object is present in the proximity of the measurement electrode, respectively. In this case the calibration of the capacitive sensor device may be initiated and carried out, respectively.

Experiments have shown that no noteworthy dependency of the difference D from the size of the object exists. However, when this dependency should exist it nevertheless is feasible to decide, whether an object is in the proximity of the measurement electrode, so that a calibration of the capacitive sensor device in this case may remain undone and may be omitted, respectively.

As shown in FIG. 3 with a difference D, which in its absolute value is smaller than the threshold value X, no calibration of the capacitive sensor system is carried out. This information, i.e. when the difference in its absolute value is smaller than the predefined threshold value X, however may be used to carry out a preliminary or provisional calibration of the sensor device. This in particular then is advantageous, when at power-on of a handheld device comprising a capacitive sensor device according to various embodiments an object already is in the proximity of a measurement electrode and nevertheless at power-on of the handheld device a calibration of the capacitive sensor device shall be carried out in order to avoid that until an advantageous point in time, at which the calibration may be carried out as described above, uncalibrated sensor raw signals are processed. This way it is ensured that during the whole operation, for example of a handheld device, the capacitive sensor device according to various embodiments is calibrated.

The above described steps of the method according to various embodiments may be carried out at predefined points in time or in a cyclic manner so that the calibration of the capacitive sensor device, if applicable, may be adapted to changing ambient conditions.

For a respective preliminary or provisional calibration of the sensor raw data the distance A from the object is estimated from the difference D and the calibrated sensor raw data corresponding to the distance are calculated and used for the calibration, i.e. for the preliminary calibration, wherein the calibrated sensor raw data are subtracted from the current sensor raw data.

Figure 4A:
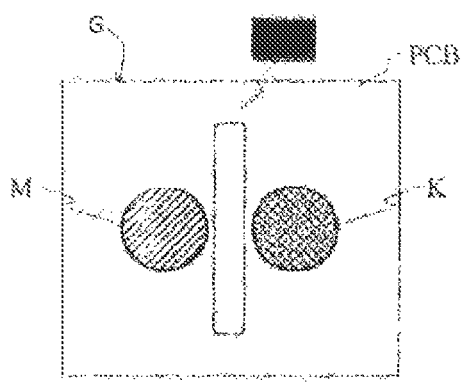
FIGS. 4a, 4b show exemplary embodiments for an arrangement of the measurement and calibration electrode, respectively, on a printed circuit board as well as a preferred embodiment of the printed circuit board.
Figure 4B:
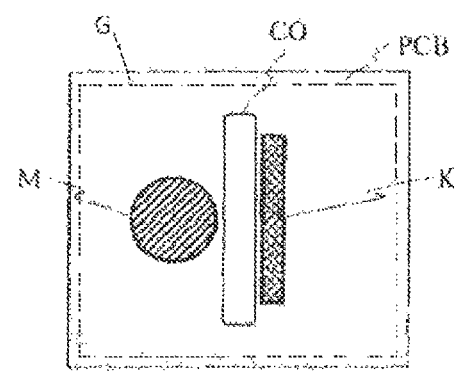

FIG. 4a and FIG. 4b each show an electrode configuration, wherein the electrodes are arranged on a printed circuit board PCB.

The amount about which the sensor raw data of the measurement electrode M change at switching of the calibration electrode K from the first operation mode into the second operation mode substantially is identified by the capacitance between the calibration electrode K and the measurement electrode M. In many cases the electrodes M, K are implemented as copper surfaces on the PCB. Depending on the material used for the printed circuit board the dimensions of the printed circuit board PCB may vary intensely in dependence on temperature variations. As a result, also the capacitance from the calibration electrode K to the measurement electrode M may be subject to a rather intense temperature dependency depending on the embodiment of the electrode design.

In order to minimize and substantially eliminate, respectively, the temperature dependency of the capacitance of the calibration electrode to the measurement electrode so that a preferably invariable estimation of the distance between an object and the measurement electrode M is ensured independent of the ambient temperature a part of the printed circuit board PCB between the measurement electrode M and the calibration electrode K may be milled out so that between the measurement electrode M and the calibration electrode K an opening is formed and substantially no material of the printed circuit board is located between the electrodes.

FIG. 4a shows the electrode arrangement shown in FIG. 1a, wherein between the two electrodes M and K a cut-out CO is provided, which substantially is designed in an elongated form.

FIG. 4b shows the electrode arrangement shown in FIG. 1d on a printed circuit board PCB, wherein between the two electrodes M, K again a substantially elongated cut-out CO is provided.

The capacitive sensor device and the method according to various embodiments for calibrating the capacitive sensor device, respectively, provide an improved basis for a decision in order to determine whether a calibration of the capacitive sensor system may be carried out. In addition, a provisional and preliminary (approximate), respectively, calibration of the capacitive sensor system may be carried out, for example when the conditions for a calibration are disadvantageous, which for example then is the case, when an object is close or very close to the measurement electrode M. Altogether it is feasible this way, to calibrate the capacitive sensor device already immediately after the activation of the sensor device, independent of whether an object is in the proximity of the measurement electrode or not. Thus, the capacitive sensor device is calibrated and may be calibrated, respectively, during the complete duration of the operation. Periods of time, in which the sensor raw data are fed to a further processing in an uncalibrated manner are effectively avoided this way, so that an invariable and correct detection of an approach and a contact, respectively, may be ensured during the complete duration of operation of the capacitive sensor device.

REFERENCE NUMERALS

A distance of an object from a measurement electrode
CO cut-out (Cut-Out) of the printed circuit board
D difference of the sensor raw data between the first operating mode and the second operating mode
B1, B2 operating modes of the calibration electrodes and of the sensor device
K, K1, K2 calibration electrodes
M, M1-M4 measurement electrodes
PCB printed circuit board
$U_{GEN}$ generator voltage, which is supplied to a generator electrode
$U_{KAL}$, $U_{KAL1}$, $U_{KAL2}$ calibrating voltages, which are supplied to the calibration electrodes
X threshold value

What is claimed is:

1. A capacitive sensor device for approach and/or contact detection, comprising at least one generator electrode, at least one measurement electrode and at least one calibration electrode, wherein the at least one calibration electrode is arranged in a predefined distance adjacent to the at least one measurement electrode, wherein the at least one measurement electrode and the at least one calibration electrode are assigned to the at least one generator electrode, wherein the at least one generator electrode receives an alternating generator voltage and the at least one calibration electrode receives an alternating calibrating voltage, and wherein the at least one calibration electrode may be operated at least in a first operating mode and a second operating mode, wherein
in each of the operating modes the calibrating voltage is equal to or smaller than the generator voltage, and
the calibrating voltage is different in each operating mode;
and further comprising an evaluation device which is configured to measure a capacitance between the measurement electrode (M) and ground while the calibration electrode is operated in the first and second operating mode, respectively and to determine a difference between the measurements, wherein the evaluation device furthermore compares the difference between the measurements with a threshold value to determine whether a calibration can be performed.

2. The capacitive sensor device of claim 1, wherein the evaluation device is configured
to load the calibration electrode with a first calibrating voltage in the first operating mode and to detect a first capacitance between the measurement electrode and the ground of the sensor device, and
to load the calibration electrode with a second calibrating voltage in the second operating mode and to detect a second capacitance between the measurement electrode and the ground of the sensor device.

3. The capacitive sensor device of claim 1, wherein the shape of the calibration electrode substantially is adapted to the shape of the measurement electrode.

4. The capacitive sensor device of claim 1, wherein the measurement electrode and the calibration electrode are arranged on a printed circuit board and wherein the printed circuit board comprises a cut-out in the region between the measurement electrode and the calibration electrode.

5. The capacitive sensor device of claim 1, wherein one calibration electrode is assigned to a number of measurement electrodes.

6. The capacitive sensor device of claim 1, wherein the generator electrode is arranged at a bottom side of a printed circuit board, and the at least one measurement electrode and the at least one calibration electrode are arranged at an upper side of the printed circuit board.

7. A method for determining whether an instant is suitable for calibrating a capacitive sensor device, wherein the sensor device comprises at least one generator electrode, at least one measurement electrode and at least one calibration electrode, wherein the at least one measurement electrode and the at least one calibration electrode are arranged in a predefined distance adjacent to each other and are assigned to the at least one generator electrode, the method comprising:
feeding an alternating generator voltage to the at least one generator electrode,
for a first measurement, feeding a first alternating calibration voltage to the calibration electrode and measuring a capacitance between the first measurement electrode (M) and ground as a first sensor signal,
for a second measurement, feeding a second alternating calibration voltage to the calibration electrode and measuring a capacitance between the first measurement electrode (M) and ground as a second sensor signal, wherein the first calibrating voltage is chosen to be different from the second calibrating voltage and both calibrating voltages are chosen such that they are equal to or less than the generator voltage;
determining a difference between the first sensor signal and the second sensor signal, and
carrying out the calibration of the capacitive sensor device, when the difference in its absolute value is greater than a predefined threshold value.

8. The method of claim 7, wherein the measurement electrode and the calibration electrode are arranged on a printed circuit board, wherein the printed circuit board comprises a cut-out in the region between the measurement electrode and the calibration electrode.

9. The method of claim 7, wherein the shape of the calibration electrode substantially is adapted to the shape of the measurement electrode.

10. The method of one of claim 9, wherein the measurement electrode and the calibration electrode are arranged on a printed circuit board, wherein the printed circuit board comprises a cut-out in the region between the measurement electrode and the calibration electrode.

11. The method of one of claim 7, wherein a preliminary calibration of the capacitive sensor device is carried out, when the difference in its absolute value is smaller than the predefined threshold value, wherein a distance of an object from the measurement electrode is derived and estimated, respectively, from the first and the second sensor signal and the sensor data of the capacitive sensor device are calibrated with the estimated distance.

12. The method of one of claim 7, wherein the first sensor signal and the second sensor signal each comprise sensor raw data.

13. A handheld device, comprising a capacitive sensor device for approach and/or contact detection, comprising at least one generator electrode, at least one measurement electrode and at least one calibration electrode, wherein the at least one calibration electrode is arranged in a predefined distance adjacent to the at least one measurement electrode, wherein the at least one measurement electrode and the at least one calibration electrode are assigned to the at least one generator electrode, wherein the at least one generator electrode receives an alternating generator voltage and the at least one calibration electrode receives an alternating calibrating voltage, and wherein the at least one calibration electrode is operated at least in a first operating mode and a second operating mode, wherein in each of the operating modes the calibrating voltage is equal to or smaller than the generator voltage, and
the calibrating voltage is different in each operating mode; and further comprising an evaluation device which is configured to measure a capacitance between the measurement electrode (M) and ground while the calibration electrode is operated in the first or second operating mode, respectively and to determine a difference between the measurements, wherein the evaluation device furthermore compares the difference between the measurements with a threshold value to determine whether a calibration can be performed.

14. The handheld device of claim 13, wherein the evaluation device is configured
to load the calibration electrode with a first calibrating voltage in the first operating mode and to detect a first capacitance between the measurement electrode and the ground of the sensor device, and
to load the calibration electrode with a second calibrating voltage in the second operating mode and to detect a second capacitance between the measurement electrode and the ground of the sensor device.

15. The handheld device of claim 13, wherein the shape of the calibration electrode substantially is adapted to the shape of the measurement electrode.

16. The handheld device of claim 13, wherein the measurement electrode and the calibration electrode are arranged on a printed circuit board and wherein the printed circuit board comprises a cut-out in the region between the measurement electrode and the calibration electrode.

17. The handheld device of claim 13, wherein one calibration electrode is assigned to a number of measurement electrodes.

18. The handheld device of claim 13, wherein the generator electrode is arranged at a bottom side of a printed circuit board, and the at least one measurement electrode and the at least one calibration electrode are arranged at an upper side of the printed circuit board.

19. A method for operating a handheld device, comprising a capacitive sensor device for approach and/or contact detection, comprising at least one generator electrode, at least one measurement electrode and at least one calibration electrode, wherein the at least one calibration electrode is arranged in a predefined distance adjacent to the at least one measurement electrode, wherein the at least one measurement electrode and the at least one calibration electrode are assigned to the generator electrode, wherein the at least one generator electrode is loaded with a generator voltage and the at least one calibration electrode is loaded with a calibrating voltage, and wherein the at least one calibration electrode is operated at least in a first operating mode and a second operating mode, wherein in each of the operating modes the calibrating voltage lies between a ground voltage and the generator voltage, and the calibrating voltage is different in each operating mode, the method comprising:

loading the at least one generator electrode with an alternating generator voltage,
for a first measurement, loading the calibration electrode with a first alternating calibration voltage and measuring a capacitance between the first measurement electrode (M) and ground as a first sensor signal,
for a second measurement, loading the calibration electrode with a second alternating calibration voltage and measuring a capacitance between the first measurement electrode (M) and ground as a second sensor signal, wherein the first calibrating voltage is chosen to be different from the second calibrating voltage and both calibrating voltages are chosen such that they are equal to or less than the generator voltage;
determining a difference between the first sensor signal and the second sensor signal, and
carrying out the calibration of the capacitive sensor device, when the difference in its absolute value is greater than a predefined threshold value.

20. The method of claim 19, wherein the measurement electrode and the calibration electrode are arranged on a printed circuit board, wherein the printed circuit board comprises a cut-out in the region between the measurement electrode and the calibration electrode.

* * * * *